(12) United States Patent
Hackl et al.

(10) Patent No.: US 10,571,525 B2
(45) Date of Patent: Feb. 25, 2020

(54) INSULATION FAULT LOCATION SYSTEMS AND METHODS FOR INSULATION FAULT LOCATION FOR A REDUNDANT DC POWER SUPPLY SYSTEM COUPLED TO DIODES

(71) Applicant: Bender GmbH & Co. KG, Gruenberg (DE)

(72) Inventors: Dieter Hackl, Fernwald (DE); Carsten Hartmann, Schotten (DE)

(73) Assignee: BENDER GMBH & CO. KG, Gruenberg (DE)

( * ) Notice: Subject to any disclaimer, the term of this patent is extended or adjusted under 35 U.S.C. 154(b) by 41 days.

(21) Appl. No.: 15/941,704

(22) Filed: Mar. 30, 2018

(65) Prior Publication Data

US 2018/0292466 A1 Oct. 11, 2018

(30) Foreign Application Priority Data

Apr. 6, 2017 (DE) .......................... 10 2017 205 931

(51) Int. Cl.
*G01R 31/40* (2014.01)
*G01R 31/02* (2006.01)
(Continued)

(52) U.S. Cl.
CPC .......... *G01R 31/40* (2013.01); *G01R 31/025* (2013.01); *G01R 31/08* (2013.01); *G01R 31/086* (2013.01); *G01R 31/1272* (2013.01); *H02J 1/06* (2013.01)

(58) Field of Classification Search
CPC ...... G01R 31/40; G01R 31/025; G01R 27/18; G01R 31/086; G01R 31/1272;
(Continued)

(56) References Cited

U.S. PATENT DOCUMENTS 5,075,628 A 12/1991 Schuster et al.
5,990,686 A * 11/1999 Vokey .................. G01R 31/088
324/509
(Continued)

FOREIGN PATENT DOCUMENTS

DE 20200501799 5/2006
DE 102005052956 B3 5/2007
(Continued)

OTHER PUBLICATIONS

W. Encelin; "EDS3090", Jan. 31, 2009; Germany; https://www.bender.de/fileadmin/content/Products/m/fr/EDS3090-v1-0_TGH_fr.pdf.

*Primary Examiner* — Vinh P Nguyen
(74) *Attorney, Agent, or Firm* — King & Schickli, PLLC (57) ABSTRACT

Insulation fault location systems and methods are for insulation fault location for an ungrounded DC power supply system, which is redundantly fed from a first direct voltage supply source coupled to diodes and a second direct voltage supply source coupled to diodes and to which a consumer is redundantly coupled. Due to the diode coupling and the asymmetric current splitting of the load current associated therewith, non-compensational partial currents arise in the supply lines in such a power supply system and consequently differential current portions, which can be captured by measuring current transformers and which can interfere with a valid test current during an insulation fault location. In order to eliminate the interfering differential current portions, compensating measures on the primary side are proposed in the measuring current transformers and indirect compensating measures on the secondary side are proposed in an insulation fault location apparatus.

12 Claims, 4 Drawing Sheets (51) Int. Cl.
   *G01R 31/08* (2020.01)
   *G01R 31/12* (2020.01)
   *H02J 1/06* (2006.01)
(58) Field of Classification Search
   CPC ...... G01R 31/083; G01R 27/02; G01R 27/06;
   G01R 31/021; G01R 15/144; G01R
   19/0092; G01R 19/2513; G01R 21/06;
   G01R 27/16; G01R 31/02; G01R 31/024;
   G01R 35/00; G01R 31/027; G01R 31/12;
   G01R 31/08; G01R 31/343; G01R 19/25;
   G01R 31/1227; G01R 1/00; G01R 22/00;
   G01R 22/068; G01R 31/026; G01R
   31/14; G01R 15/142; G01R 1/30; G01R
   27/2688; G01R 31/001; G01R 31/041;
   G01R 31/3842; G01R 31/42; G01N
   27/90; G01N 2021/7773; H02B 13/0356;
   G05B 23/0283; G05B 2219/21155; G05B
   19/048; G05B 19/406; G05B 19/4061;
   G05B 2219/45044; H02J 1/108; H02J
   1/10; H02P 27/06; H02P 29/0241
   See application file for complete search history.

(56) References Cited

U.S. PATENT DOCUMENTS

| | | | | |
|---|---|---|---|---|
| 9,863,997 | B2* | 1/2018 | Poluru | G01R 31/08 |
| 9,952,271 | B2* | 4/2018 | Dalban Pilon | G01R 31/08 |
| 10,126,345 | B2* | 11/2018 | Hackl | G01R 27/18 |
| 10,151,790 | B2* | 12/2018 | Hackl | G01R 19/0092 |
| 10,396,545 | B2* | 8/2019 | Pieler | H02H 3/20 |

FOREIGN PATENT DOCUMENTS

| | | |
|---|---|---|
| EP | 2793339 A1 | 10/2014 |
| EP | 2813856 A1 | 12/2014 |

* cited by examiner

Fig. 1
State of the art

INSULATION FAULT LOCATION SYSTEMS AND METHODS FOR INSULATION FAULT LOCATION FOR A REDUNDANT DC POWER SUPPLY SYSTEM COUPLED TO DIODES

This application claims the benefit of German Patent Application No. 10 2017 205 931.1, filed Apr. 6, 2017, the disclosure of which is incorporated by reference.

TECHNICAL FIELD

The invention relates to insulation fault location systems and methods for insulation fault location which is redundantly fed from a first Direct voltage supply source coupled to diodes and a second Direct voltage supply source coupled to diodes and to which a consumer is redundantly coupled via a first supply line consisting of two active conductors and a second supply line consisting of two active conductors.

For supplying electric operating means, the grounding system of an ungrounded power supply system is used when the requirements to the operational, fire and contact safety are increased, said grounding system also being known as an isolated network (French: Isolé Terre—IT) or an IT power supply system. In this type of power supply system, the active parts are separate from the ground potential—with respect to "ground". The advantage of these networks is that at a first insulation fault such as a ground fault or a body contact, the function of the electric operating means is not impaired since a closed circuit cannot be formed owing to the ideally infinitely large impedance value between the active conductors of the network and the ground in this first fault instance (first fault).

Owing to the inherent security of the ungrounded power supply system, a continuous power supply of the consumers coupled to the ungrounded power supply system can thus be ensured even when a first insulation fault arises.

The electric resistance of the ungrounded power supply system to ground (insulation resistance—in the event of a fault also an insulation fault resistance or fault resistance) is therefore constantly monitored since a fault loop would occur via a possible other fault at a different active conductor (second fault) and the fault current flowing in conjunction with an overcurrent protective device could cause the installation to be shut down and operations to standstill.

Provided that the insulation condition of the ungrounded power supply system is continuously monitored by an insulation monitoring device, the ungrounded power supply system can continue to be operated without stipulated time limitation even when a first fault has arisen although eliminating the first fault as quickly as possible is recommended according to the standards DIN VDE 0100-410 and IEC 6034-4-41.

In order to fulfill the requirement to quickly eliminating the first fault, the usage of an insulation fault location system, which generally comprises a test current generator and an insulation fault location system (evaluation device) having measuring current transformers coupled thereto, represents the state of the art in particular in expanded and complex ungrounded power supply systems or in ungrounded power supply systems in which a shut down of the power supply for the entire ungrounded power supply system can be dangerous to security.

If a first insulation fault is identified in the ungrounded power supply system by the insulation monitoring device, the insulation fault location is commenced by the test current generator, which can be realized as a separate device as well as a component of the insulation fault monitoring device, generating a test current and supplying said test current into the ungrounded power supply system at a central position. A closed circuit is realized in which the test current or a test current portion flows from the test current generator back to the test current generator via the live active conductors, the insulation fault and a ground connection.

The insulation fault location apparatus having the measuring current transformers coupled thereto serves for locating the fault location in the ungrounded power supply system, a measuring current transformer being determinedly assigned to each of the conductor branches to be monitored.

The test current or the test current portion is captured by all measuring current transformers, which are in the test current circuit (fault current circuit), and evaluated and indicated by the insulation fault location apparatus. The fault location can be located by the known assignment of the measuring current transformers to the conductor branches.

In installations relevant to security or significant to the security of supply, such as railroad systems, power plants or electric power transformation stations, higher requirements exist for an operation free of disruptions.

These requirements are fulfilled by redundantly configured power supply systems. In ungrounded DC power supply systems, consumers, which are relevant to security and coupled to diodes, are therefore often redundantly supplied from two Direct voltage supply sources via two separate supply lines (conductor branches).

However, the topology of the doubly configured DC power supply system coupled to diodes can lead to interferences when locating faults.

Due to the diode coupling, non-compensating partial currents arise in the supply lines (asymmetric current splitting of the load current) and consequently differential current portions also arise, which can be captured by the respective measuring current transformer and which can interfere with a valid test current.

The slightest fluctuations of one of the two supply voltages can lead to a modulation of the operating points of the non-linear diode characteristics and thus to a mutual forward-bias fluctuation at the two diodes. In particular slight low-frequency fluctuations of the supply voltage in a frequency area, which is preferably used by the insulation fault location system for generating a test current (for example voltage fluctuations having an amplitude of 50 mV at a frequency of 1 Hz), can result in a current flow whose frequency position and amplitude approximately correspond to the test signal generally used by the insulation fault location system.

Different diode characteristics can also result in a DC differential current even under otherwise symmetric proportions.

A faulty detection of the test current and thus an interference of the insulation fault location therefore appear to be highly likely.

If the supply voltages of the redundant Direct voltage supply sources are different, a relatively large DC differential current can thus also arise, in particular as a function of the amplitude of the direct voltages and the value of the load resistance of the consumer.

When using commercially available measuring current transformers, a large DC differential current in turn can lead to a deteriorated selectivity when locating faults, i.e. to an impaired determination of the fault in subordinated supply branches, all the way to a shortfall of the fault location via satiation effects in the core material of the measuring current transformer.

From the state of the art, three different approaches are known for solving the problems described above:

a) Usage of the so-called Holmgreen circuit. This corresponds to a parallel circuit of several measuring current transformers on the secondary side. This circuit is successfully used for obtaining the sum current in pure AC systems (50 Hz, 60 Hz). A prerequisite for a satisfactory functionality, however, is a good concordance of the transmission properties of the interconnected measuring current transformers.

In systems having low-frequency signal portions and DC components, the method works in a very limited manner in standard measuring current transformers (type A measuring current transformers) since these signal components are not or merely insufficiently captured by the standard measuring current transformers.

b) One-sided increase of the supply voltage in one of the two DC voltage sources.

The result of this approach, however, is a relatively large DC differential current which can lead to the abovementioned satiation effect in the core material of the magnet circuit of the measuring current transformer in a disadvantageous manner.

c) A temporary mutual cancellation of the double feed of individual consumers while locating faults. This approach requires a manual intervention of experienced experts and contains the risk of forgetting to correctly re-install the double feed of the consumer after completing the fault location.

Splitting the connection between the negative poles of the two redundant direct voltage supply sources could be helpful, however, this is not admissible in most installations since certain fault situations to be observed can lead to the redundant direct voltage supply sources to be switched in series and problems with the insulation coordination in the installation to possibly arise due to the line-to-line voltage occurring because of this.

A fully automatic fault location thus cannot be realized in this manner in most instances of application.

SUMMARY

The object of the invention at hand is therefore to simplify fault location in ungrounded DC power supply systems coupled to diodes from a technical point of view and to design the fault location reliably as well as economically.

Insulation fault location system A: This object is attained using an insulation fault location system A by a first resistance path being arranged between the active conductors of the first supply line and a second resistance path being arranged between the active conductors of the second supply line, the electric resistance of each resistance path being dimensioned such that a compensating current flows in the respective resistance path which is equal to an interfering DC differential current in the respective supply line caused by increasing the supply voltage and which is captured on the primary side in the opposite direction of the DC differential current by the respective measuring current transformer.

The basic idea of this embodiment consists of initially increasing one of the two supply voltages on one side as known from the state of the art by means of a setting device arranged on one of the two direct voltage supply sources and then weakening the interfering DC differential current caused by the one-sided increase so far that identifying the test current or the test current portion is reliably possible and the fault location is therefore not negatively influenced. By generating a compensating current, the DC differential current is mostly compensated on the primary side in the respective measuring current transformer in order to prevent satiation effects in the core material of the measuring current transformer. For this purpose, a passive resistance path is installed between the active conductors of the first supply line and between the active conductors of the second supply line, respectively, in such a manner that the compensating current flows through the respective measuring current transformer in the opposite direction of the interfering DC differential current and thus unfolds its compensational effect. The respective resistance path comprises a consistent electric resistance having a value which is measured such that the compensating current driven by a potential difference (voltage) occurring between the active conductors has a value which corresponds to the value of the interfering DC differential current.

It suffices if enough compensation takes place so that the influence of the magnetic circuit of the measuring current transformer remains below a threshold up to which the insulation fault location system A can function without any error according to specifications.

Owing to the arrangement of the resistance path according to the invention, the parallel circuit of the measuring current transformer on the secondary side can be omitted. As the selectivity is increased when determining the fault location in consequence of a mostly fault-free detection of the test current, the faulty supply branch can be reliably located.

Insulation fault location system B: The object is further attained using an insulation fault location system B by a current path being arranged between the active conductors of the first supply line and between the active conductors of the second supply line, respectively, using a current setting device which sets a compensating current dependent on load current, said compensating current being equal to an interfering DC differential current in the respective supply line caused by increasing the supply voltage and being captured on the primary side in the opposite direction of the DC differential current by the respective measuring current transformer.

The basic idea of this embodiment also rests upon compensating the interfering DC differential current, which is caused by increasing one of the two supply voltages on one side, on the primary side in the measuring current transformer via a compensating current after said increase.

When there are relatively large fluctuations in the load resistance, however, the compensation of the DC differential current on the primary side by means of a passive resistance path having a consistent electric resistance cannot suffice for keeping the influence of the magnetic circuit of the measuring current transformer low and for thus enabling a fault location as specified in the technical data of the used insulation fault location system.

Therefore, a current path is arranged using a current setting device instead of a passive resistance path being arranged between the active conductors of the first supply line and between the active conductors of the second supply line, respectively, said current setting device setting a compensating current dependent on load current, the value of said compensating current being equal to an interfering DC differential current in the respective supply line caused by increasing the supply voltage and being oriented in the opposite direction of the interfering DC differential current.

Starting from the idea that a reduction of the load resistance leads to an inversely proportional increase of the load current, this change in load current can in turn be used for a proportional increase of the compensating current. The compensational quality is improved so far that an influence of the magnetic circuit of the measuring current transformer remains below the threshold which enables a fault location as specified in the technical data of the used insulation fault location system.

The requirements to the DC load current measurement are not all too high for this purpose. Inexpensive semi-conductor sensors or similarly inexpensive DC sensors can be used in the most instances of application.

The object of the setting in dependence of load current according to the invention, which can be realized as a control or regulation, is to maintain the specified tolerance limits of the measuring current transformers being put to use and to not carry out an entire compensation in the area of the measuring accuracy of the used insulation fault location systems, as for example in compensating current transformers.

In another advantageous embodiment, the current setting device comprises a settable current source for generating the compensating current as well as a current sensor for measuring DC load current.

The DC load current is captured in one of the two active conductors of the respective supply line using a current sensor, the measuring signal of the current sensor being used for controlling the settable current source proportionally to load current. The current sensor can be configured as a semi-conductor sensor or a similarly inexpensive DC sensor.

Using the insulation fault location systems A and B described above according to the invention, a high sensitivity is achieved in conjunction with inexpensive standard measuring current transformers (type A measuring current transformers) when detecting the test current and thus a reliable fault location.

Insulation fault location system C.1: The object is further attained using an insulation fault location system C.1 by the first measuring current transformer and the second measuring current transformer being configured as all-current sensitive measuring current transformers (type B measuring current transformers) having a current output and being switched parallel on the secondary side for indirectly compensating differential current portions.

In contrast to the two aforementioned insulation fault location systems A and B, a setting device for increasing a supply voltage (if available) remains disregarded in the insulation fault location system C.1; one of the two supply voltages is therefore not increased on one side in this embodiment. Instead, all-current sensitive measuring current transformers (type B measuring current transformers) are used for capturing the differential current portions flowing in the supply lines and a circuitry-wise subtraction of the measuring signals provided by the two measuring current transformers is undertaken.

Type B measuring current transformers, which have a current output and are switched parallel on the primary side, are used in the insulation fault location system C.1. Measuring signals (measuring currents) supplied by the measuring current transformers are circuitry-wise subtracted using the parallel circuit and thus differential currents oriented in the opposite direction and captured on the primary side are indirectly compensated, in particular DC and low-frequency differential current portions besides the pure AC differential currents (as an advantage with respect to the known Holmgreen circuit).

Insulation fault location system C.2: The object is further attained by using an insulation fault location system C.2 by the first measuring current transformer and the second measuring current transformer being configured as all-current sensitive measuring current transformers (type B measuring current transformer) having a voltage output and being switched in series on the secondary side for indirectly compensating differential current portions.

As in the previously described alternative embodiment (insulation fault location system C.1), a setting device for increasing a supply voltage is not required in the insulation fault location system C.2 and all-current sensitive measuring current transformers (type B measuring current transformer) are also used. However, the measuring current transformers in the insulation fault location system C.2 are configured as type B measuring current transformers having a voltage output, whose outputs are switched in series on the secondary side.

The measuring signals (measuring voltages) supplied by the measuring current transformers are subtracted circuitry-wise using the series connection and thus differential currents oriented in the opposite direction and captured on the primary side, in particular DC and low-frequency differential current portions besides the pure AC differential currents, are indirectly compensated.

Insulation fault location system C.3: The object is further attained using an insulation fault location system C.3 by the first measuring current transformer and the second measuring current transformer being configured as all-current sensitive measuring current transformers (type B measuring current transformer) and the insulation fault location apparatus comprising an evaluation unit which indirectly compensates differential current portions computationally.

In this other alternative embodiment without the usage of a setting device for increasing a supply voltage, any arbitrary type B measuring current transformers can be used. The insulation fault location apparatus is modified to the extent that it comprises an evaluation unit which evaluates the measuring signals provided by the measuring current transformers via computational subtraction and thus indirectly compensates differential currents, which are oriented in the opposite direction and captured on the primary side, in particular DC and low-frequency differential current portions besides the pure AC differential currents.

Insulation fault location system D: The object is further attained based on one of the insulation fault location systems C.1, C.2 or C.3, the resistance path of the insulation fault location system A or the current path having a current setting device of the insulation fault location system B being installed as a supplementary compensating device.

The insulation fault location systems C.1, C.2 and C.3 (which do not comprise a setting device for increasing a supply voltage but are equipped with all-current sensitive measuring current transformers (type B measuring current transformers)) can thus comprise the resistance path (insulation fault location system A) or the current path having a current setting device (insulation fault location system B) as an additional compensating measure. Besides indirectly compensating the differential current portions on the secondary side, the DC differential currents are directly compensated on the primary side by means of a passive resistance path or an active current path.

The advantage of this combined embodiment lies in the fact that the requirements for the dynamic range of the type B measuring current transformers for compensating the interfering DC differential current are lower. Smaller and thus also more inexpensive current transformers can be used since part of the compensation is carried out via the resistance path or the current path having a current setting device.

The aforementioned insulation fault location systems C.1, C.2, C.3 and D enable considerably lowering the requirements for these measuring current transformers regarding the dynamic range by using type B measuring current transformers while still realizing a high sensitivity and reliability when locating faults in DC power supply systems coupled to diodes at less costs.

All described insulation fault location systems A, B, C.1, C.2, C.3 and D each represent a device-related embodiment of a method for insulation fault location in an ungrounded DC power supply system.

The insulation fault location systems A, B, C.1, C.2, C.3 and D claimed according to the invention are therefore based on corresponding methods for insulation fault location A, B, C.1, C.2, C.3 and D according to claims 8, 9, 11, 12, 13 and 14 from which the cited advantageous technical effects can be derived.

BRIEF DESCRIPTION OF THE DRAWING FIGURES

Further advantageous embodiments can be derived from the following description and the drawings which describe a preferred embodiment of the invention by means of examples. In the figures.

DETAILED DESCRIPTION

Figure 1:
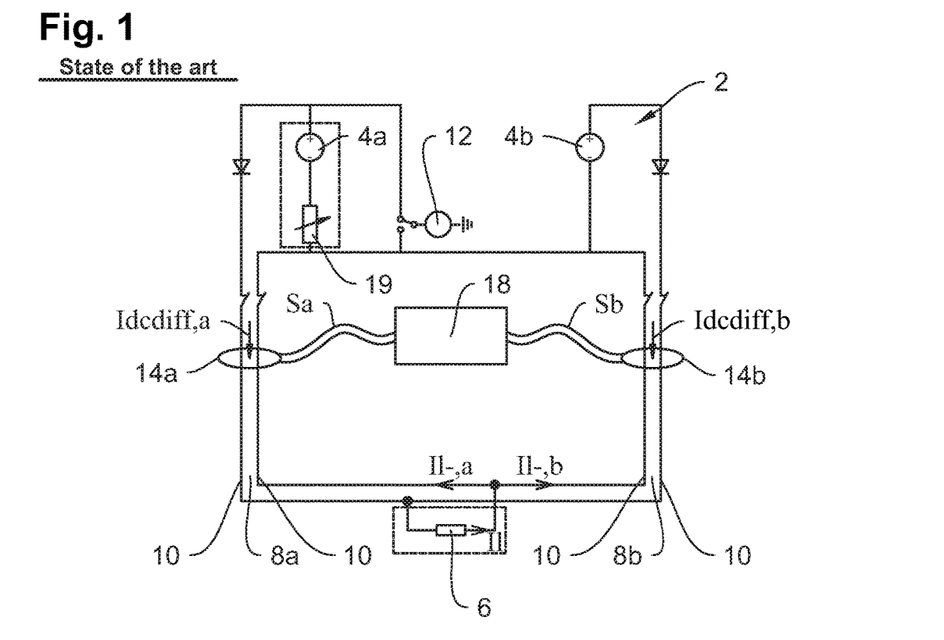
FIG. 1 illustrates an ungrounded power supply system having a redundant direct voltage supply coupled to diodes and having functional elements of an insulation fault location system according to the state of the art.

In FIG. 1, an ungrounded DC power supply system 2 is illustrated which is redundantly fed from a first direct voltage supply source 4a coupled to diodes and a second direct voltage supply source 4b coupled to diodes. A consumer 6 is coupled to the DC power supply system 2 via two spatially separated, redundant supply lines 8a, 8b which each consist of two active conductors 10.

After an insulation fault was signaled by an insulation monitoring device (not illustrated), the insulation fault location is commenced by a test current generator 12 alternately supplying a test current to the active conductors 10 of the DC power supply system 2 on one side and to ground on the other side at a central position.

A first measuring current transformer 14a for capturing a first test current portion flowing in the first supply line 8a and a second measuring current transformer 14b for capturing a second test current portion flowing in the second supply line 8b are installed in order to follow the test current circuit (fault current circuit). The measuring current transformers 14a, 14b are coupled to an insulation fault location apparatus 18 for evaluating provided measuring signals Sa, Sb.

The supply voltage is directly increased at the first direct voltage supply source 4a using a setting device 19 integrated in the direct voltage supply source 4a in order to suppress a mutual modulation of the source voltages of the direct voltage supply source 4a, 4b and to thus prevent any differential currents, which interfere with the test current, from arising.

The setting device 19 is required for setting only one of the two direct voltage supply sources 4a or 4b; said setting device 19 could therefore also be arranged on the direct voltage supply source 4b instead of on the direct voltage supply source 4a as shown in FIG. 1 in an exemplary manner.

Increasing the supply source in interaction with the asymmetric load current splitting (splitting the load current Il into the unequal partial load currents Il-a and Il-b) leads to DC differential currents Idcdiff,a, Idcdiff,b, which can sensitively disturb capturing the test current via the measuring current transformers 14a, 14b, in the respective supply lines 8a, 8b.

Instead of slightly increasing the supply voltage on one side, the forward biases of the couple diodes could generally be chosen in sufficiently differing sizes or one of the diodes could be substituted by a series circuit of several diodes in order to achieve the same effect.

Figure 2:
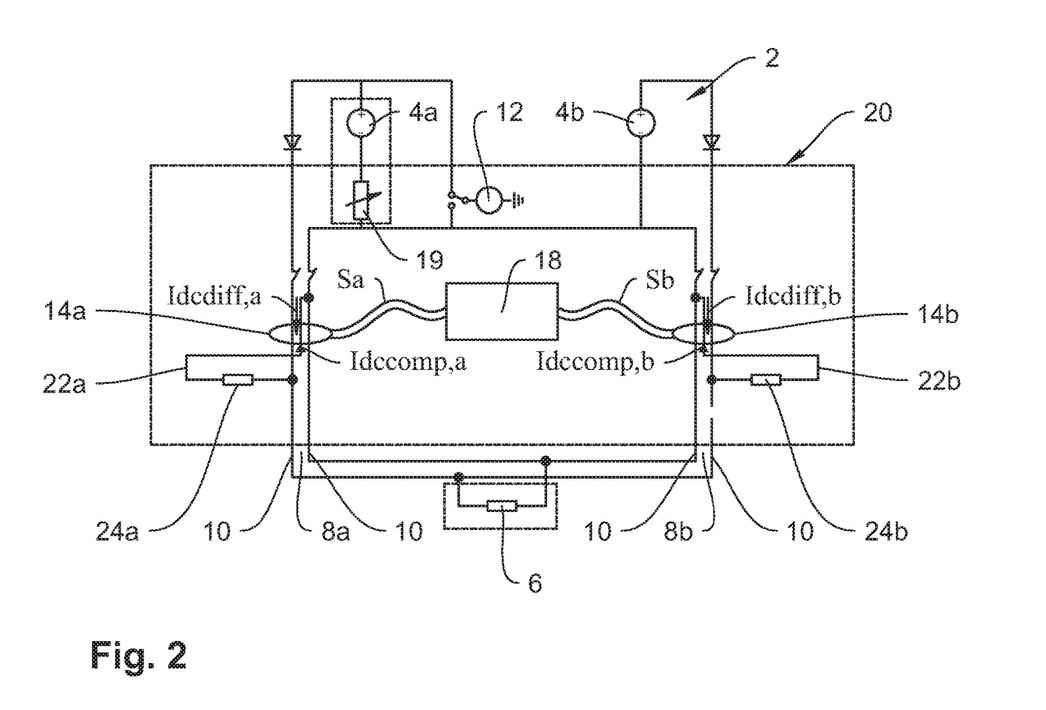
FIG. 2 illustrates the ungrounded power supply system having an insulation fault location system A according to the invention.

FIG. 2 illustrates the ungrounded power supply system 2 having an insulation fault location system A 20 according to the invention.

According to the invention, the insulation fault location system A 20 comprises resistance paths 22a, 22b, each being arranged between the active conductors 10 in the respective supply lines 8a, 8b, besides the functional blocks test current generator 12, setting device 19 for increasing a supply voltage and insulation fault location device 18 having a first and second measuring current transformer 14a, 14b, each being known from the state of the art.

The resistance paths 22a, 22b are carried out passively and comprise resistances 24a, 24b which are each measured such that a compensating current Idccomp,a, Idccomp,b flows in the resistance path 22a, 22b and is equal to the interfering DC differential current Idcdiff,a, Idcdiff,b in the respective supply line 8a, 8b caused by increasing the supply voltage. For this purpose, the compensating currents Idccomp,a Idccomp,b are guided in the opposite direction in the measuring current transformers 14a, 14b to the interfering DC differential currents Idcdiffa, Idcdiff,b on the primary side in order to compensate the DC differential currents Idcdiff,a Idcdiff,b and to thus prevent satiation effects in the core material of the measuring current transformers 14a, 14b which would otherwise be caused by uncompensated differential currents Idcdiff,a, Idcdiffb.

Figure 3:
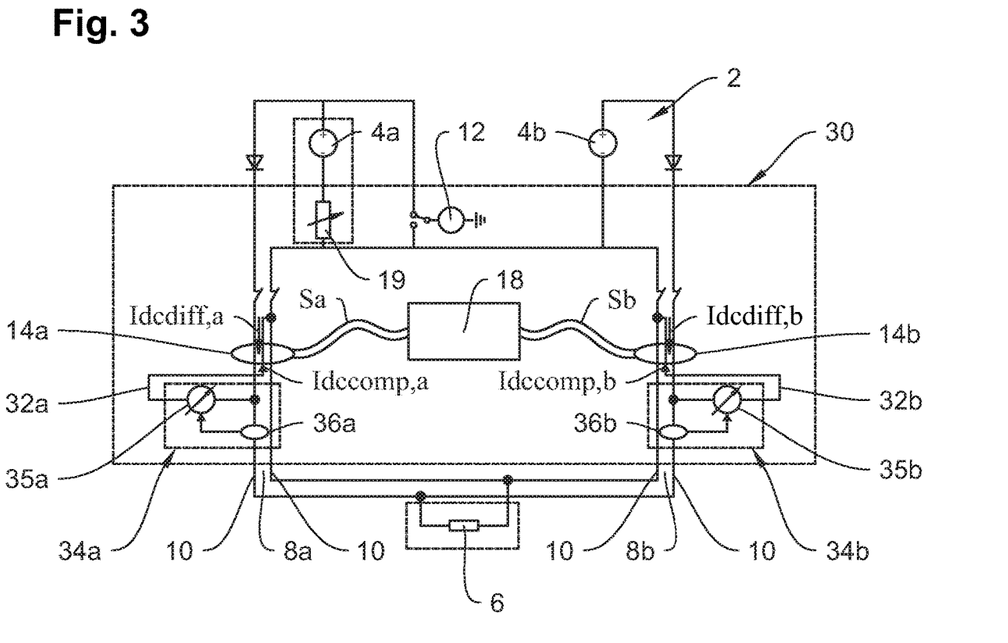
FIG. 3 illustrates the ungrounded power supply system having an insulation fault location system B according to the invention.

In FIG. 3, the ungrounded power supply system 2 having an insulation fault location system B 30 according to the invention is illustrated.

In contrast to the insulation fault location system A 20 illustrated in FIG. 2, the insulation fault location system B 30 comprises, instead of a passive resistance path 22a, 22b, a current path 32a, 32b having a current setting device 34a, 34b between the active conductors 10 of the first supply line 8a and between the active conductors 10 of the second supply line 8b, respectively. The current setting device 34a, 34b comprises a settable current source 35a, 35b for generating the compensating current Idccomp,a, Idccomp,b, and a current sensor 36a, 36b for measuring DC load current.

The setting devices 34*a*, 34*b* execute a setting dependent on load current of the compensating currents Idccomp,a, Idccomp,b in order to compensate the DC differential currents Idcdiff,a, Idcdiff,b, as in the insulation fault location system A 20.

Figure 4:
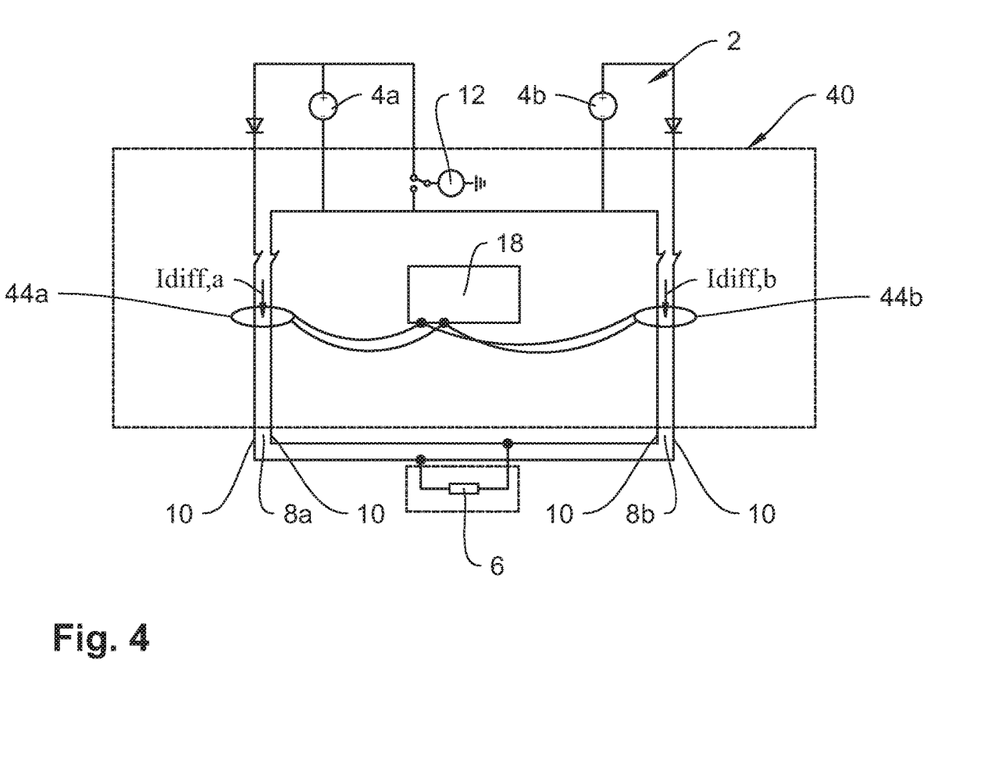
FIG. 4 illustrates the ungrounded power supply system having an insulation fault location system C.1 according to the invention.

FIG. 4 illustrates the ungrounded power supply system 2 having an insulation fault location system C.1 40 according to the invention.

Figure 5:
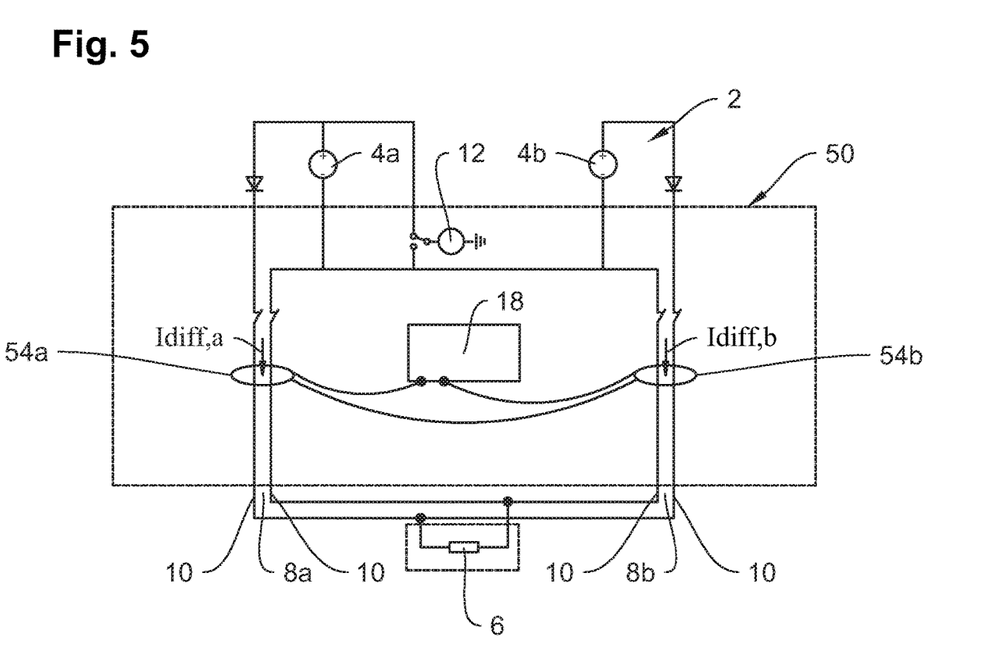
FIG. 5 illustrates the ungrounded power supply system having an insulation fault location system C.2 according to the invention.
Figure 6:
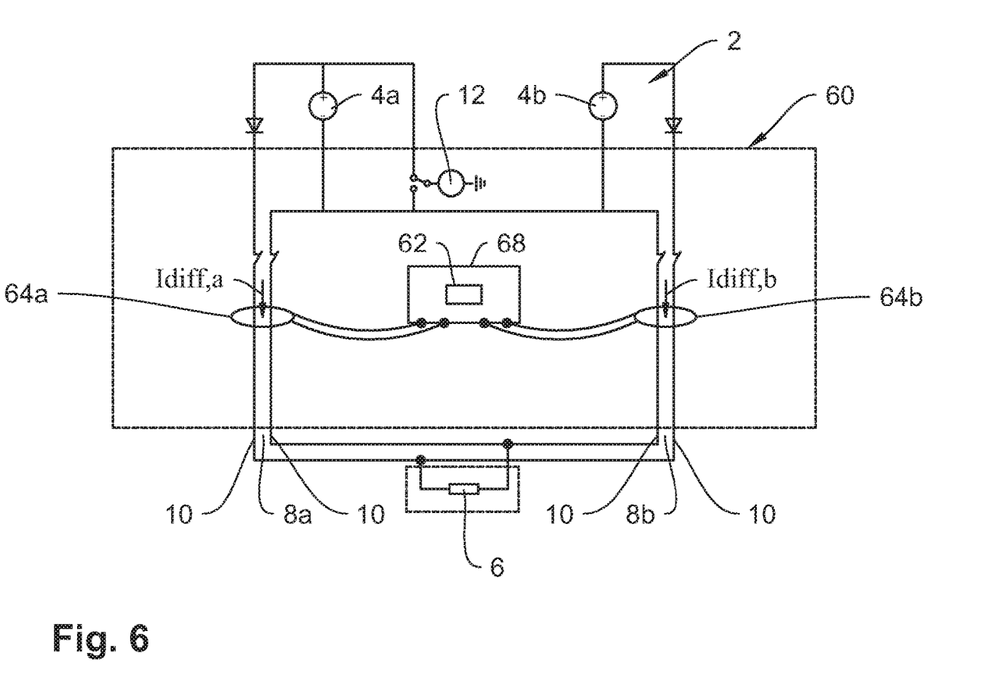
FIG. 6 illustrates the ungrounded power supply system having an insulation fault location system C.3 according to the invention.

In contrast to the aforementioned insulation fault location system A 20 (FIG. 2) and the insulation fault location system B 30 (FIG. 3), increasing one of the supply voltages of the direct voltage supply sources 4*a*, 4*b* by means of a setting device 19 is omitted in the insulation fault location system C.1 40 (FIG. 4), the insulation fault location system C.2 50 (FIG. 5) and the insulation fault location system C.3 60 (FIG. 6).

Instead, all-current sensitive measuring current transformers (type B measuring current transformers) having a current output 44*a*, 44*b* (insulation fault location system C.1 40), having a current output 54*a*, 54*b* (insulation fault location system C.2 50) and any arbitrary type B measuring current transformers 64*a*, 64*b* (insulation fault location system C.3 60) are used which enable capturing all AC and DC differential current portions Idiff,a Idiff,b.

The measuring current transformers 44*a*, 44*b* of the insulation fault location system C.1 40 are configured as type B measuring current transformers having a current output so that a parallel circuit (circuitry-wise subtraction) on the secondary side causes the differential current portions Idiff,a, Idiff,b to be compensated at the clamps of the insulation fault location apparatus 18.

FIG. 5 illustrates the ungrounded power supply system 2 having an insulation fault location system C.2 50 according to the invention.

In contrast to the aforementioned insulation fault location system C.1 40 in FIG. 4, type B measuring current transformers 54*a*, 54*b* having a voltage output are used in the insulation fault location system C.2 50 in FIG. 5. The measuring current transformers 54*a*, 54*b* are switched in series on the secondary side at the clamps of the insulation fault location apparatus 18 so that a circuitry-wise subtraction is also available in this instance, which compensates the interfering differential current portions Idiff,a, Idiff,b.

FIG. 6 illustrates the ungrounded power supply system 2 having an insulation fault location system C.3 60 according to the invention.

Any arbitrary type B measuring current transformers 64*a*, 64*b* can be used in the insulation fault location system C.3 60 since the separately recorded measuring signals provided by the measuring current transformers 64*a*, 64*b* are evaluated computationally. For this purpose, the insulation fault location device 68 comprises an evaluation unit 62.

Figure 7:
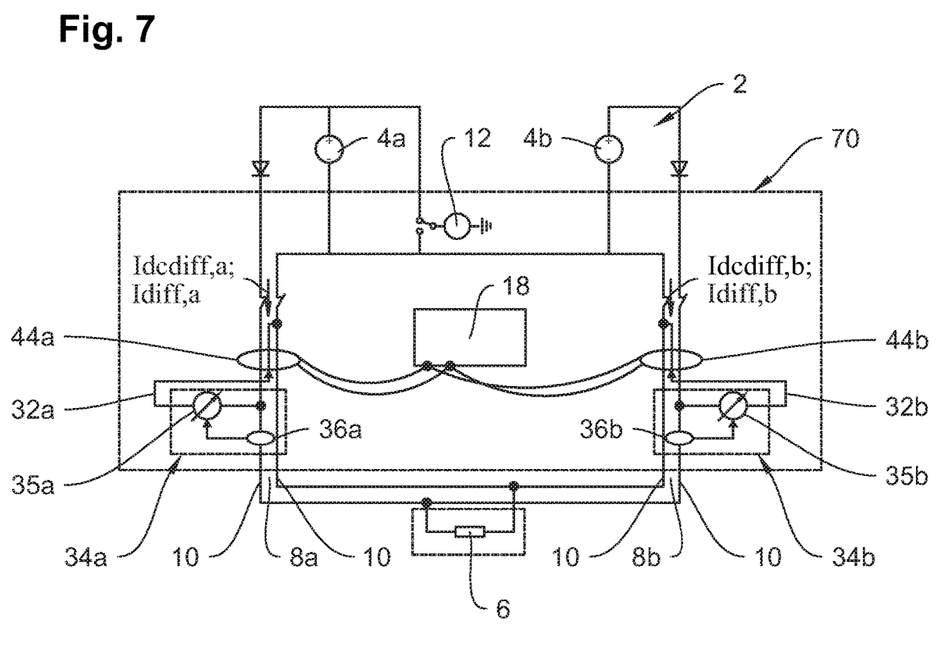
FIG. 7 illustrates the ungrounded power supply system having an insulation fault location system D according to the invention.

In FIG. 7, the ungrounded power supply system 2 having an insulation fault location system D 70 according to the invention is illustrated.

The insulation fault location system D 70 rests upon one of the insulation fault location system C.1, C.2 or C.3 and therefore does not comprise a setting device 19 (FIG. 1, FIG. 2) for increasing a supply voltage; however, a direct compensation on the primary side of the DC differential currents Idcdiff,a Idcdiff,b from the insulation fault location system A 20 (FIG. 2) or from the insulation fault location system B 30 (FIG. 3) is additionally used.

In an exemplary manner, the active current paths 32*a*, 32*b* from the insulation fault location system B 30 (FIG. 3) have been integrated into the insulation fault location system D 70 based on the insulation fault location system C.1 40 (FIG. 4).

The insulation fault location system D 70 thus comprises a combination of a compensation of the DC differential currents Idcdiff,a, Idcdiff,b on the primary side dependent on load current and a (indirect) circuitry-wise compensation (a parallel circuit in this instance) of differential current portions Idiff,a, Idiff,b on the secondary side.

The advantage towards an individual application of one of the insulation fault location systems is that the requirements for the dynamic range of the type B measuring current transformer for executing the compensation are lower. Smaller and thus more inexpensive measuring current transformers can be used.

The invention claimed is:

1. An insulation fault location system (40) for an ungrounded DC power supply system (2), which is redundantly fed from a first Direct voltage supply source (4*a*) coupled to diodes and a second Direct voltage supply source (4*b*) coupled to diodes and to which a consumer (6) is redundantly coupled via a first supply line (8*a*) including two active conductors (10) and a second supply line (8*b*) including two active conductors (10), comprising a test current generator (12) for feeding a test current and an insulation fault location apparatus (18), to which a first measuring current transformer (44*a*) for capturing a first test current portion flowing in the first supply line (8*a*) and a second measuring current transformer (44*b*) for capturing a second test current portion flowing in the second supply line (8*b*) are coupled, wherein the first and the second measuring current transformer (44*a*, 44*b*) are configured as all-current sensitive measuring current transformers having a current output and are switched parallel on the secondary side for indirectly compensating differential current portions (Idiff,a, Idiff,b).

2. An insulation fault location system according to claim 1, wherein a resistance path having a current setting device is installed as a complementary compensational device.

3. An insulation fault location system (50) for an ungrounded DC power supply system (2), which is redundantly fed from a first Direct voltage supply source (4*a*) coupled to diodes and a second Direct voltage supply source (4*b*) coupled to diodes and to which a consumer (6) is redundantly coupled via a first supply line (8*a*) including two active conductors (10) and a second supply line (8*b*) including two active conductors (10), comprising a test current generator (12) for supplying a test current and an insulation fault location apparatus (18), to which a first measuring current transformer (54*a*) for capturing a first test current portion flowing in the first supply line (8*a*) and a second measuring current transformer (54*b*) for capturing a second test current portion flowing in the second supply line (8*b*) are coupled, wherein the first measuring current transformer (54*a*) and the second measuring current transformer (54*b*) are configured as all-current sensitive measuring current transformers having a voltage output and are switched in series on a secondary side for indirectly compensating differential current portions (Idiff,a, Idiff,b).

4. An insulation fault location system according to claim 3, wherein a current path having a current setting device is installed as a complementary compensational device.

5. An insulation fault location system (60) for an ungrounded DC power supply system (2), which is redundantly fed from a first Direct voltage supply source (4*a*) coupled to diodes and a second Direct voltage supply source (4*b*) coupled to diodes and to which a consumer (6) is redundantly coupled via a first supply line (8*a*) including two active conductors (10) and a second supply line (8*b*) including two active conductors (10), comprising a test current generator (12) for supplying a test current and an insulation fault location apparatus (68), to which a first measuring current transformer (64*a*) for capturing a first test current portion flowing in the first supply line (8*a*) and a second measuring current transformer (64*b*) for capturing a second test current portion flowing in the second supply line (8*b*) are coupled, wherein the first measuring current transformer (64*a*) and the second measuring current transformer (64*b*) are configured as all-current sensitive measuring current transformers, and the insulation fault location apparatus (68) comprises an evaluation unit (62), which indirectly compensates a differential current portion (Idiff,a, Idiff,b) computationally.

6. An insulation fault location system according to claim 5, wherein a current path having a current setting device is installed as a complementary compensational device.

7. A method for insulation fault location in an ungrounded DC power supply system (2), which is redundantly fed from a first Direct voltage supply source (4*a*) coupled to diodes and a second Direct voltage supply source (4*b*) coupled to diodes and to which a consumer (6) is redundantly coupled via a first supply line (8*a*) including two active conductors (10) and a second supply line (8*b*) including two active conductors (10), comprising the method steps:
  feeding a test current using a test current generator (12),
  capturing a first test current portion flowing the first supply line (8*a*) using a first measuring current transformer (44*a*) coupled to an insulation fault location apparatus (18), and capturing a second test current portion flowing in the second supply line (8*b*) using a second measuring current transformer (44*b*) coupled to the insulation fault location apparatus (18),
  parallel switching the first measuring current transformer (44*a*) and the second measuring current transformer (44*b*), which are configured as all-current sensitive measuring current transformers having a current output, on a secondary side for indirectly compensating differential current portions (Idiff,a, Idiff,b).

8. The method for insulation fault location according to claim 7, wherein as supplementary method steps for compensating an interfering DC differential current, generating a compensating current driven by the Direct voltage supply sources in a resistance path or generating a compensating current dependent on load current in a current path.

9. A method for insulation fault location in an ungrounded DC power supply system (2), which is redundantly fed from a first Direct voltage supply source (4*a*) coupled to diodes and a second Direct voltage supply source (4*b*) coupled to diodes and to which a consumer (6) is redundantly coupled via a first supply line (8*a*) including two active conductors (10) and a second supply line (8*b*) including two active conductors (10), comprising the method steps:
  supplying a test current using a test current generator (12)
  capturing a test current portion flowing in the first supply line (8*a*) using a measuring current transformer (54*a*) coupled to an insulation fault location apparatus (18), and capturing a second test current portion flowing in the second supply line (8*b*) using a second measuring current transformer (54*b*) coupled to the insulation fault location apparatus (18),
  switching the first measuring current transformer (54*a*) and the second measuring current transformer (54*b*), configured as all-current sensitive measuring current transformers having a voltage output, in series on a secondary side for indirectly compensating differential current portions (Idiff,a, Idiff,b).

10. The method for insulation fault location according to claim 9, wherein as supplementary method steps for compensating an interfering DC differential current, generating a compensating current driven by the Direct voltage supply sources in a resistance path or generating a compensating current dependent on load current in a current path.

11. A method for insulation fault location in an ungrounded DC power supply system (2), which is redundantly fed from a first Direct voltage supply source (4*a*) coupled to diodes and a second Direct voltage supply source (4*b*) coupled to diodes and to which a consumer (6) is redundantly coupled via a first supply line (8*a*) including two active conductors (10) and a second supply line (8*b*) including two active conductors (10), comprising the method steps:
  supplying a test current using a test current generator (12),
  capturing a first test current portion flowing in the first supply line (8*a*) using a first measuring current transformer (64*a*) coupled to an insulation fault location apparatus (68), and capturing a second test current portion flowing in the second supply line (8*b*) using a second measuring current transformer (64*b*) coupled to the insulation fault location apparatus (68),
  evaluating the measuring signals, which are provided by the measuring current transformers (64*a*, 64*b*) configured to be all-current sensitive, by indirectly compensating differential current portions (Idiff,a, Idiff,b) computationally.

12. The method for insulation fault location according to claim 11, wherein as supplementary method steps for compensating an interfering DC differential current, generating a compensating current driven by the Direct voltage supply sources in a resistance path or generating a compensating current dependent on load current in a current path.

* * * * *